United States Patent [19]

Westerberg et al.

[11] 4,385,238

[45] May 24, 1983

[54] REREGISTRATION SYSTEM FOR A CHARGED PARTICLE BEAM EXPOSURE SYSTEM

[75] Inventors: Eugene R. Westerberg; Donald R. Cone, both of Palo Alto; Julius J. Muray, Los Altos; Jan C. Terry, Palo Alto, all of Calif.

[73] Assignee: Veeco Instruments Incorporated, Melville, N.Y.

[21] Appl. No.: 240,084

[22] Filed: Mar. 3, 1981

[51] Int. Cl.³ .............................................. H01J 37/00
[52] U.S. Cl. ............................. 250/491.1; 250/492.2
[58] Field of Search ..................... 250/491, 492.2, 398; 313/363

[56] References Cited

U.S. PATENT DOCUMENTS

| | | | |
|---|---|---|---|
| 3,843,916 | 10/1974 | Trotel et al. | 250/492.2 |
| 3,849,659 | 11/1974 | O'Keefe | 250/492.2 |
| 3,875,414 | 4/1975 | Prior | 250/492.2 |
| 3,900,736 | 8/1975 | Michael et al. | 250/492.2 |
| 4,123,661 | 10/1978 | Wolf et al. | 250/492.2 |
| 4,164,658 | 8/1979 | Frosien | 250/492.2 |

Primary Examiner—Bruce C. Anderson
Attorney, Agent, or Firm—Morgan, Finnegan, Pine, Foley & Lee

[57] ABSTRACT

A reregistration system for determining and positioning the location of a substrate target surface with respect to a plurality of charged particle beams used to directly write an integrated circuit pattern simultaneously at a plurality of locations on the substrate is disclosed.

Reregistration is accomplished by scanning two or more of the charged particle beams over a corresponding number of reregistration fiducial marks on the substrate. The reregistration marks may consist of a material having a high atomic number or predefined topographical features. Electrons scattered from these marks are detected and converted to electrical signals. The temporal relationship between the scanning beams and the resultant electrical signals may then be used to determine substrate location.

28 Claims, 5 Drawing Figures

REREGISTRATION SYSTEM FOR A CHARGED PARTICLE BEAM EXPOSURE SYSTEM

BACKGROUND OF THE INVENTION

This invention relates to the field of charged particle beam lithography systems, and more particularly to a reregistration system for a parallel charged particle beam exposure system.

As integrated circuits become more complex there is a general trend in the semiconductor industry toward increasing device packaging density. The present philosophy is to keep chip or die sizes as small as possible, and so increase device yield. However, it is obvious that chip size cannot be arbitrarily reduced because of the inherent resolution limits of presently used photolithographic processes. In particular, the wavelength of light imposes a barrier to the reproduction of detail in the region of one micrometer ($\mu$m).

A number of solutions have been proposed to solve the resolution problem and there is considerable activity in this area presently underway in the semiconductor industry. These solutions are based on lithographic techniques that employ particles of shorter wavelengths than visible light to overcome the resolution limitation. Generally, two classes of short wavelength particles have been proposed as alternatives to light, i.e., high energy photons (X-rays) and electrons.

An optimal lithographic system would have to possess certain attributes in order for it to be a serious contender for use in the production of integrated circuits. These attributes include resolution, coverage, lithographic speed, reregistration capability, and stability.

At present, minimum reproducible line widths on the order of 1 $\mu$m are in use, and future integrated circuit structures will probably push the desired system resolution requirements to below $\frac{1}{4}$ $\mu$m. The exposure subsystem should be capable of covering the standard 75 mm and/or 100 mm wafers presently used in industry and be expandable to cover the larger (125 mm and 150 mm) sized wafers being contemplated. Clearly wafer exposure times measured in tens of minutes to hours are not acceptable in production exposure systems. Acceptable throughput conditions demand full 75 mm and/or 100 mm wafer exposure times of at most a few minutes.

A parallel charged particle beam exposure system is described in a commonly assigned copending application of Eugene R. Westerberg and Ivor Brodie, Ser. No. 227,620 filed Jan. 23, 1981, the disclosure of which is incorporated herein by reference. In this sytem, the throughput capability of conventional types of lithography systems is increased significantly by utilizing a parallel charged particle beam exposure system for directly writing an integrated circuit pattern simultaneously at a plurality of locations on a target surface.

The multilayer structure of integrated circuits necessitates that there be reregistration mechanism built into the exposure system. In general, reregistration capabilities should be a minimum of a factor of five times better than the size of the smallest detail required.

Moreover, the requirement for a very uniform electric field in the screen lens-wafer space inherent in the type of system disclosed in the aforementioned application of Westerberg and Brodie affects the reregistration process. More specifically, since the full wafer area is being written on simultaneously (rather than a chip or restricted area at a time) any signal detectors must be placed near the edge of the wafer area to avoid interference with the writing beams, and distortion of the uniform field. Likewise, since the electric field must be very uniform over the entire wafer area, the uniform field must be maintained for a significant distance beyond the edge of the wafer, to avoid edge effects.

The reregistration techniques utilized with known charged particle beam exposure systems operate in an essentially field free region, and therefore can attract, accelerate and use emitted low-energy secondary electrons for reregistration position sensing. In the aforementioned application of Westerberg and Brodie a high voltage is applied between the screen lens and wafer to provide a very uniform accelerating (and focusing) field for the multiplicity of beamlets produced by the screen lens. Accordingly, this precludes the practical utilization of low energy secondaries as taught in the prior art. For example, U.S. Pat. No. 3,875,414 issued to Prior shows the use of a fiducial mark for each field-of-accurate-deflection; e.g., 100 $\mu$m $\times$ 100 $\mu$m. They are composed of very thin metal bars applied on top of the resist. A very low beam electron charge density is used to address the mark for registration, e.g., about 1% of the required writing charge density, to avoid exposing the underlying resist prior to the writing of the pattern in the field-of-accurate-deflection, including the area under the fiducial marks. This limits the scanning current during the reregistration process, which can limit the quality of the signal to be detected. In addition, the time required to reregister on each subfield reduces the time available for pattern writing and hence the throughput of the equipment.

Similarly, U.S. Pat. No. 3,900,736 issued to Michail et al., calls for reregistration at all four corners of each writing scan field to precisely define its position relative to the desired position, in order to provide corrections during the writing process for each scan field.

In addition, the utilization of a multiplicity of beamlets to directly write an integrated circuit pattern simultaneously at a corresponding plurality of locations on a target surface imposes stringent tolerance and performance requirements on the reregistration system. In particular, since the reregistration procedure is performed only once per full wafer exposure, not for each chip or die or subfield of same (at or near each individual chip location) any serious error in reregistration could cause misalignment and thus rejection of the entire wafer. Additionally, global (once per wafer exposure) registration can accommodate homogeneous changes in the wafer, such as might occur from high-temperature processing, or changes in the wafer ambient temperature between successive exposures, but cannot correct for local random movement of the prior exposed pattern on the wafer surface which, if accompanied by similar movement of the adjacent fiducial marks, could be at least partially corrected during a chip-by-chip reregistration process. However, using only a few (e.g., 2 to 4) reregistration fiducial marks in lieu of 1 or more per chip (i.e., a hundred or more for a 100 mm wafer) justifies use of more precision in fabrication of suitable fiducial marks. In addition, since time is of the essence in wafer production, reregistration only once per wafer exposure, instead of on the order of 100 times for the chip-by-chip procedure, permits more time to be invested in the global registration, to achieve improved position information by using advanced signal processing techniques and/or longer signal averaging times. Likewise, since the fiducial marks are near the edge of the wafer, they can be interrogated by the reregistration beamlets without disturbing the normal writing area of the wafer. Additionally, with multiple beam writing, the total wafer writing time can be on the order of 10 seconds, hence long term electrical or thermal drifts will have only minimal effect on the pattern writing accuracy.

It is accordingly a general object of the present invention to overcome the aforementioned limitations and drawbacks associated with the known systems and to fulfill the needs mentioned by providing a reregistration system for a charged particle beam exposure system having all of the desirable attributes noted above.

It is a particular object of the invention to provide a high resolution reregistration system for a charged particle beam exposure system.

Other objects will be apparent in the following detailed description and the practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as the combination of a system which utilizes a plurality of charged particle beams to directly write a predetermined pattern on a substrate target and a reregistration means for positionally aligning the substrate target relative to the plurality of charged particle beams. In accordance with the teachings of the invention, two or more of the charged particle beams are scanned in a circular path over two or more corresponding fiducial marks. The fiducial marks have a predetermined number of radially disposed segments and are situated at predetermined locations on the surface of the substrate target. The interception of the scanning beams by the radially disposed segments of their corresponding fiducial marks causes charged particles to be scattered from each of the fiducial marks. The charged particles scattered from each of the fiducial marks are converted into a corresponding electrical reregistration signal.

The relative positioning of the substrate target and the plurality of charged particles is changed to effect alignment between each of the scanning beams and its corresponding fiducial mark. The direction and magnitude of the positioning change is determined from the temporal relationship between each of the scanning beams and its corresponding reregistration signal, and the number of and temporal spacings between the intercepts of each of the reregistration signals.

Positional alignment between the substrate target and the plurality of charged particle beams is achieved when for each of the reregistration signals the number of intercepts thereof equals the number of radially disposed segments of its corresponding fiducial mark and the temporal spacings between the intercepts are equal.

BRIEF DESCRIPTION OF THE DRAWINGS

Serving to illustrate an exemplary embodiment of the invention are the drawings of which.

DETAILED DESCRIPTION OF THE PREFERRED EMBODIMENT

Figure 1:
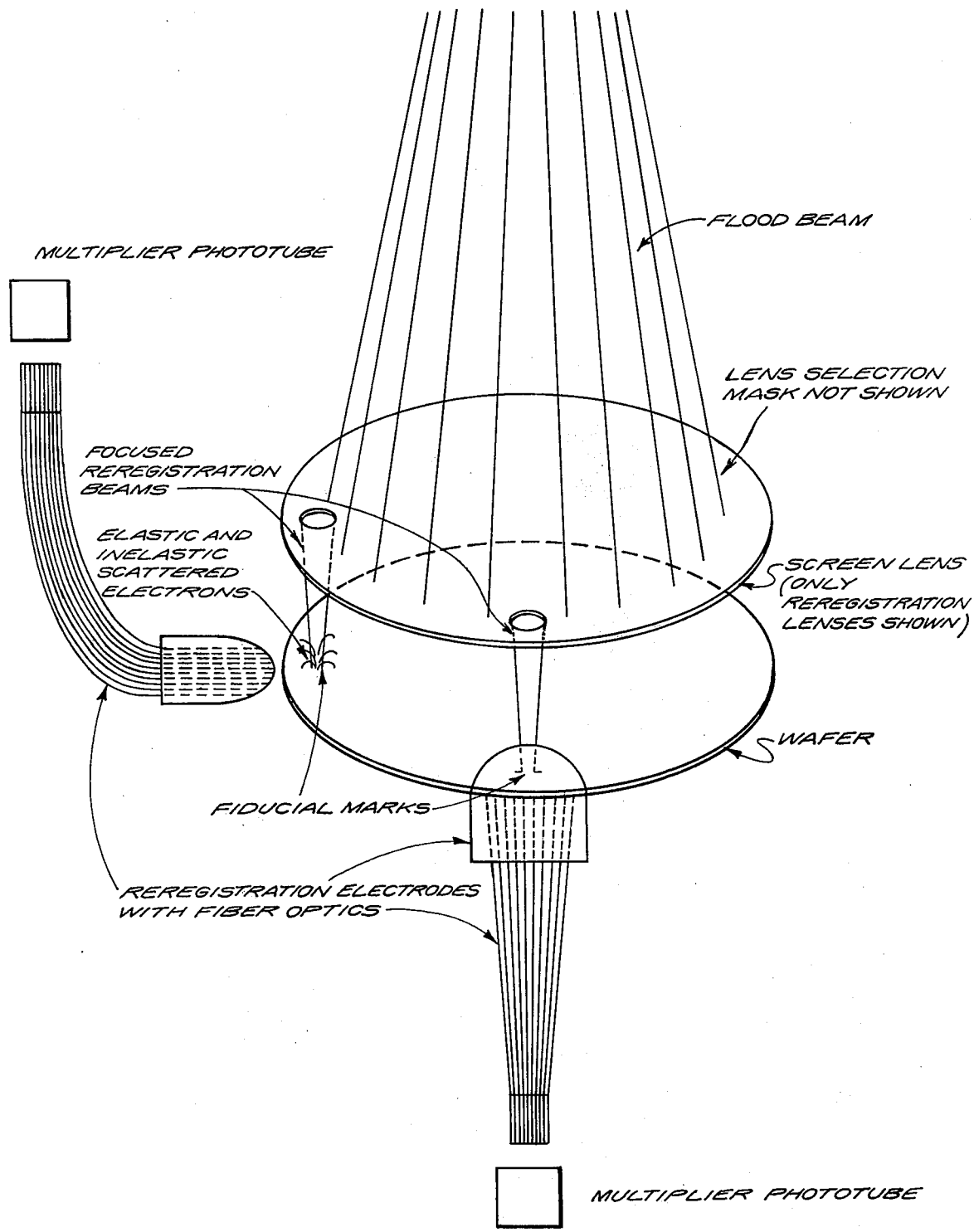
FIG. 1 is a schematic diagram of the reregistration system, in accordance with the present invention.

A schematic diagram of one embodiment of the reregistration system in accordance with the present invention is illustrated in FIG. 1.

As shown therein, substrate registration is accomplished by scanning two or more electron beams, formed by the screen lens, over a corresponding number of reregistration marks on the wafer substrate. The reregistration marks may consist of a material having a high-atomic-number or topographical features.

Figure 2:
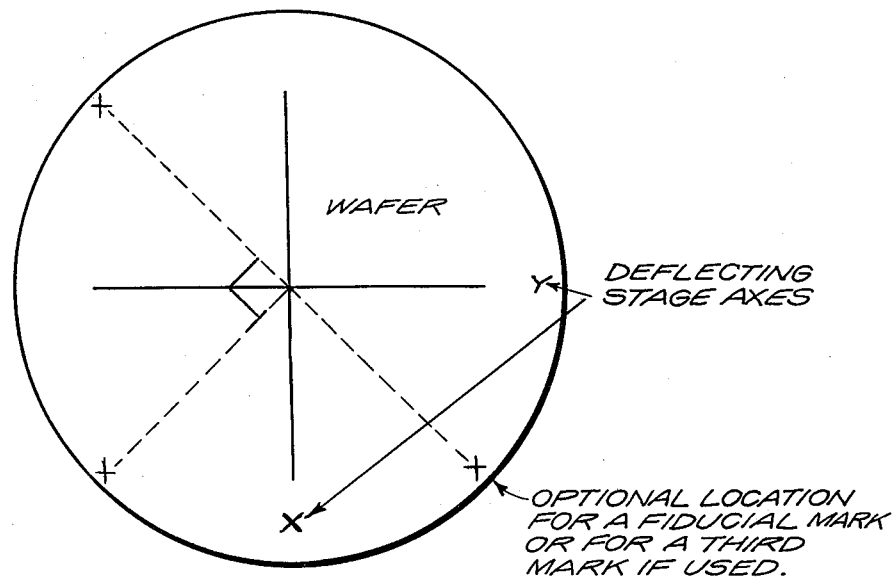
FIG. 2 illustrates the location of the registration fiducial marks on the wafer substrate.

As illustrated in more detail in FIG. 2, two (or more) fiducial marks are provided near the edge of each wafer (+ symbols) with each leg on the order of 100 $\mu$m long and 5 $\mu$m wide. They should be widely dispersed around the perimeter of the wafer, i.e., preferably 90° to 180° apart.

These marks can be formed by a number of well-known wafer processing techniques, to provide either well-defined topographic or high-atomic-number material features on the wafer surface. This could entail using the reregistration beamlets from the screen lens, and either electrostatic deflection of the beams, controlled motion of a precision stage (not shown), or a combination thereof, to expose the desired precision pattern in the resist coated wafer at the impact position of the reregistration beamlets. Alternatively, the reregistration patterns could be formed on a mask in the desired configuration and positions, and applied to the wafer using existing optical exposure systems and conventional processing.

These marks are formed in the wafer by topographic structuring, or by using a high-atomic-number (Z) elemental material such as gold or tantalum or compounds such as tungsten silicide. Care should be exercised in selecting a material not affected by nor affecting the many required wafer processing steps.

As the electron beam is scanned across the sample surface, it passes over these differing material or topographic registration marks. Two common topographic types are a raised pedestal or an etched hole of Si or $SiO_2$.

Figure 3:
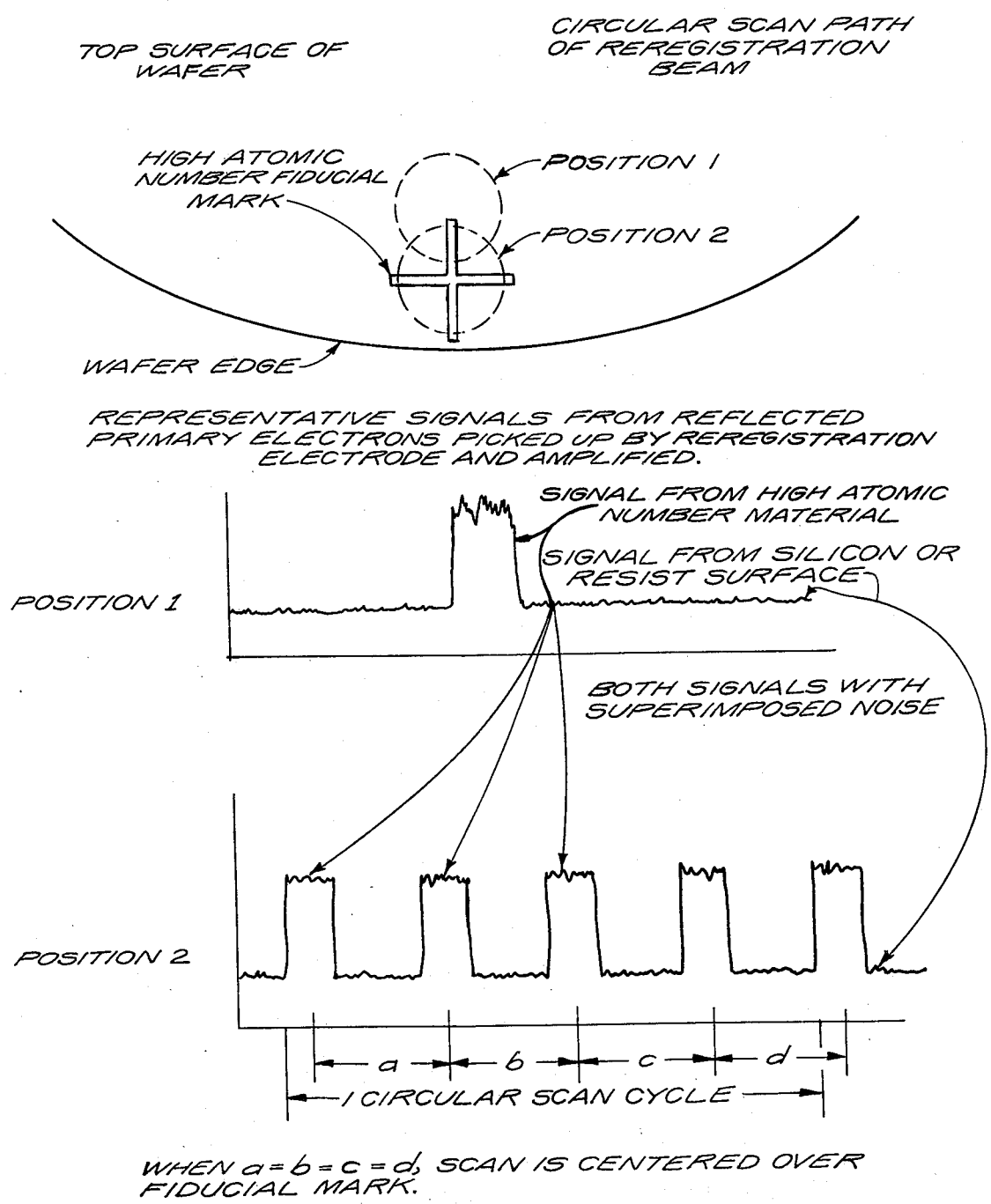
FIG. 3 illustrates reregistration signal generation by interaction with the substrate.

The signal detected by the reregistration system has two major constituents. The first is the elastically and inelastically scattered electrons resulting from the impact of the primary beam. (The low-energy secondaries will be attracted back to the wafer by the focusing field.) The signal from the high energy backscattered electrons will increase in intensity when the beam moves from the low atomic number silicon or resist to the high atomic number material of the fiducial mark. This is illustrated in FIG. 3. The second part is a noise component that contains the statistical noise of the primary beam (a small effect) and any other noise arising from the scattering and detection processes.

Figure 5:
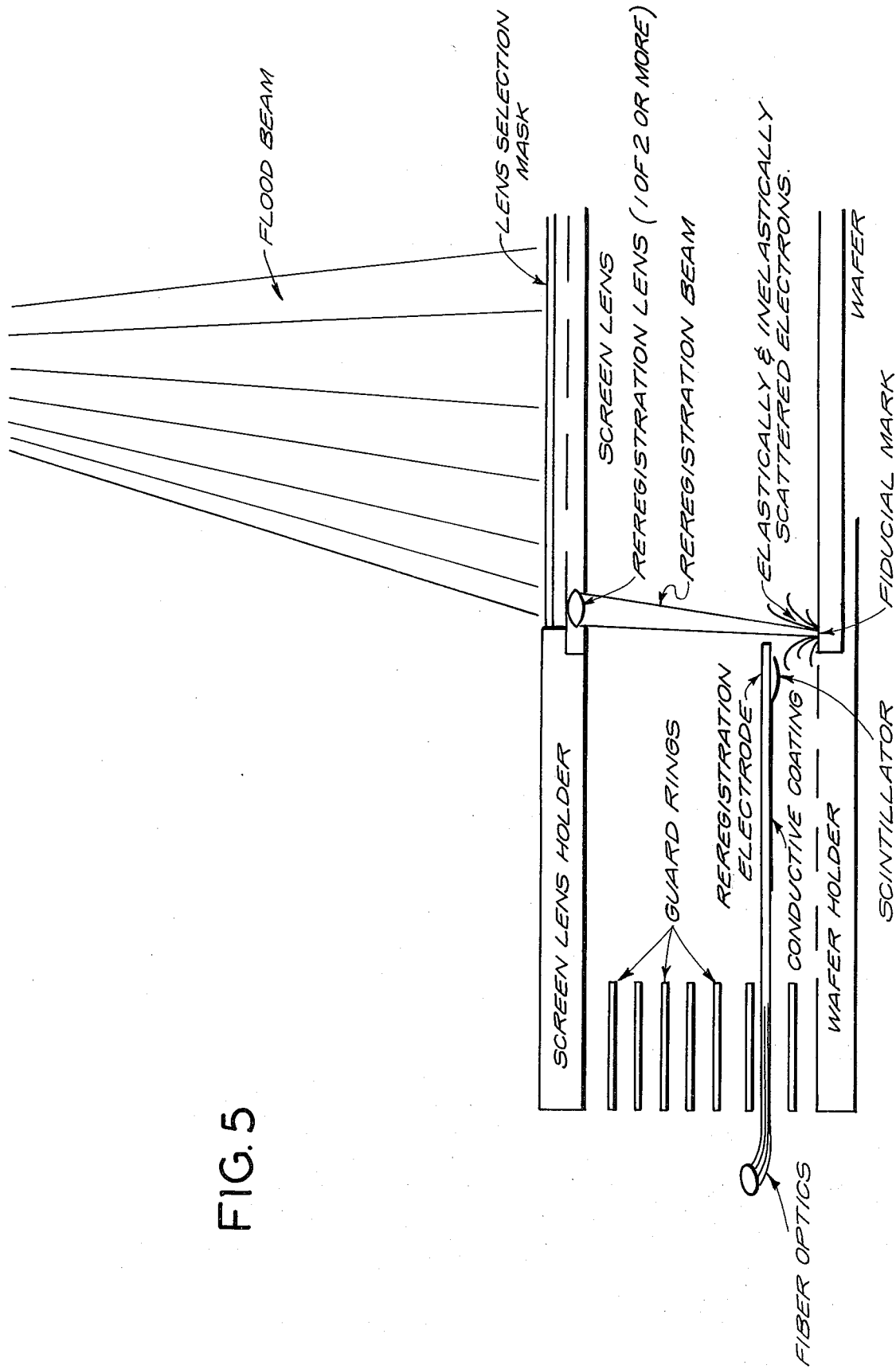
FIG. 5 illustrates the location of reregistration signal pickup electrodes on a screen lens/guard ring assembly.

As illustrated in FIGS. 1 and 5, the backscattered electrons emerge in many directions and possess energies varying from the primary beam value down to about fifty eV. This broad spectrum is caused by elastic and/or multiple inelastic scattering of the electrons in the substrate, registration mark, and resist layer(s). To be detected, an electron emerging from the substrate must be travelling in a given direction and have an energy sufficient to reach the detector.

When a reregistration beamlet scan intersects a portion of its corresponding fiducial mark, the number of reflected primary electrons emitted in a given direction will change because of the topographical configuration, or they will increase as a function of the relative Z number of the mark material and of the background silicon or oxide wafer surface or the superimposed resist.

Figure 4:
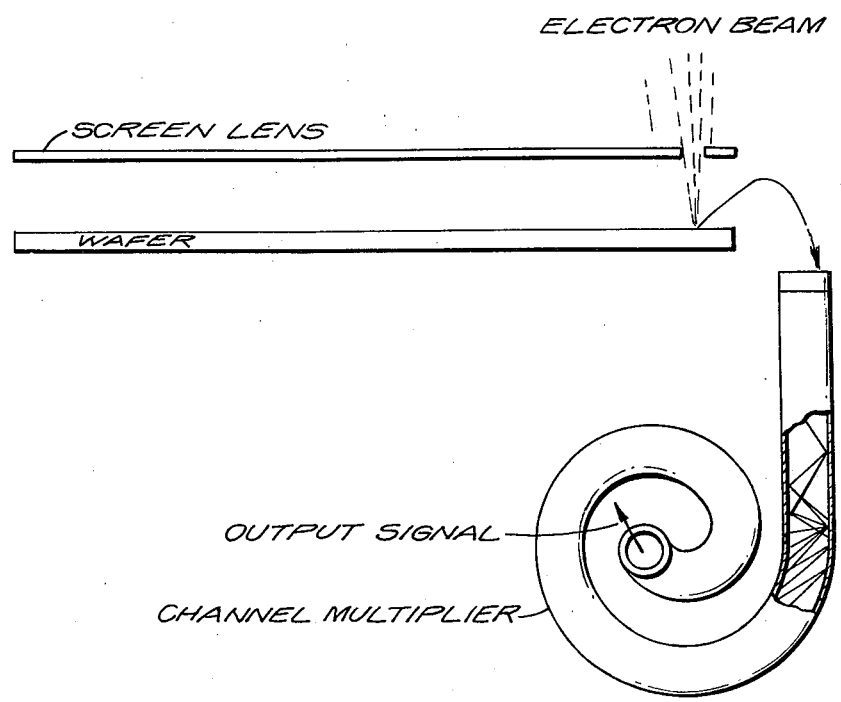
FIG. 4 illustrates an alternative system for producing the reregistration signal.

Electrons scattered from these marks are detected and converted to electrical signals. One effective means for detecting such signals is to interpose a scintillator (electron to photon converter) material in the path of the scattered electrons. It is important that the detector does not disturb the electric field between the screen lens and the wafer. The resulting optical signals from the scintillators are conducted along a fiber-optic path to a multiplier phototube and the light projected onto the photo-emissive surface. There it is converted back to electrons, which are multiplied to provide a highly amplified output electrical signal. As illustrated in FIG. 4, as an alternative, a "bare" electron multiplier structure in proximity to the fiducial mark may be utilized to amplify the scattered electron signal directly, without the lossy electron-photon-electron conversions.

Referring now to FIG. 5, a schematic diagram of the reregistration signal pickup electrodes on a screen lens/guard ring is illustrated. As illustrated, a thin metal electrode is mounted from the second or third guard ring up from the wafer plane. This electrode extends in from the guard ring structure to a point just outboard from the wafer edge and 2 to 6 mm above the fiducial mark. It will be at the potential of the guard ring on which it is mounted (on the order of 6–8 kV). A scintillator material is applied to the lower face of the electrode near the tip, where a portion of the elastically scattered electrons from the reregistration beam will impact. The light generated can be picked up by a fiber-optic light pipe placed under the scintillator at or below the wafer plane, or by a ribbon or series of small fiber optics light pipes adjacent to and coupled into the scintillator, the follow the electrode surface through the guard rings. The scintillator and fiber optics are covered with a thin conductive material such as aluminum (transmissive to both electrons and photons) to avoid charging of the non-conductive scintillator and fiber optic materials. Either configuration then continues to an optically clear vacuum exit port in proximity to the input face of the multiplier phototube.

In the preferred embodiment a thin ribbon array of optic fibers are embedded in the scintillator material and serve as a light guide coupled to the multiplier phototube. This thin flat electrode detector geometry minimizes distortion of the electric field. If it were infinitely thin, flat, and in the plane of the guard ring, it would not distort the field at all. If necessary, the tip of the electrode, near the wafer, could be laminated, and suitably stepped voltages applied to more closely approximate the extant electrical field.

The vertical positioning of the detector electrode is also critical. The height above the fiducial mark, as well as the tip shape, will determine the portion of the reflected primary electrons intercepted. These electrons also lose energy as they rise from the wafer surface because of the opposing electric field; the further they rise the less available energy for conversion into photons. Alternatively, if these photons are being picked up by a fiber optic light pipe below the wafer surface, the intercepted optical solid angle will decrease as the electrode moves up.

The temporal relationship between the scanning beams and the resultant electrical signals may then be used to determine the substrate location.

As an example, partially illustrated in FIG. 3, the reregistration beam can be rotated in a circular scan of appropriate diameter, and the scan pattern moved until 1 or more elements of the fiducial mark are intercepted. From knowledge of the position of the beam on the circular path at the time of intercept, the direction towards the center of the fiducial mark can be determined, and either the beam or the wafer (or both) moved so that the circular path intercepts all four elements of the fiducial mark. When the time (spacing) between the centers of the four intercept pulses are equal, the center of the fiducial mark and the beam scan circle are coincident, hence the position of the fiducial mark is accurately determined relative to the beam.

Repeating this process for two or more fiducial marks will accurately establish the position of the wafer relative to the reregistration (and the writing) beams. By repetitively moving a stage (not shown) used to support the wafer substrate in the X, Y, Z and O axes, the substrate may be brought into very precise alignment with the impinging beams. Alternatively, or in combination, the beam deflection system may be used to accurately register the subsequent pattern relative to the fiducial mark.

Just as the parallel charged particle beam system described in the aforementioned application of Westerberg and Brodie may be modified to work with an ion rather than electron source, the reregistration system of the present invention may be modified accordingly.

Thus, it is clear that the above-description of the preferred embodiment in no way limits the scope of the present invention which is defined by the following claims.

What is claimed is:

1. In combination with a system which utilizes a plurality of charged particle beams to directly write a predetermined pattern on a substrate target, reregistration means for positionally aligning said substrate target relative to said plurality of charged particle beams comprising:
   (a) means for scanning in a circular path at least two of said charged particle beams over a corresponding number of fiducial marks having a predetermined number of radially disposed segments and being situated at predetermined locations on the surface of said substrate target, the interception of the scanning beams by the radially disposed segments of their corresponding fiducial marks causing charged particles to be scattered from each of said fiducial marks;
   (b) means for converting the charged particles scattered from each of said fiducial marks into a corresponding electrical reregistration signal; and
   (c) means for changing the relative positioning of said substrate target and said plurality of charged particle beams to effect alignment between each of the scanning beams and its corresponding fiducial mark, the direction and magnitude of the positioning change being determined from the temporal relationship between each of the scanning beams and its corresponding reregistration signal, and the number of and temporal spacings between the intercepts of each of the reregistration signals, the positional alignment between said substrate target and said plurality of charged particle beams being achieved when for each of the reregistration signals the number of intercepts thereof equals the number of radially disposed segments of its corresponding fiducial mark and the temporal spacings between the intercepts are equal.

2. A reregistration system as recited in claim 1 wherein said charged particle beams consist of electrons.

3. A reregistration system as recited in claim 1 wherein said charged particle beams consist of ions.

4. A reregistration system as recited in claim 2 wherein said fiducial marks consist of a predetermined geometric pattern formed of a material having a high atomic number.

5. A reregistration system as recited in claim 2 wherein said fiducial marks consist of a predetermined topographic feature.

6. A reregistration system as recited in claim 3 wherein said fiducial marks consist of a predetermined geometric pattern formed of a material having a high atomic number.

7. A reregistration system as recited in claim 3 wherein said fiducial marks consist of a predetermined topographic feature.

8. In combination with a system which utilizes a plurality of charged particle beams to directly write a predetermined pattern on a substrate target, reregistration means for positionally aligning said substrate target relative to said plurality of charged particle beams comprising:
(a) means for scanning in a circular path at least two of said charged particle beams over a corresponding number of fiducial marks having a predetermined number of radially disposed segments and being situated at predetermined locations on the surface of said substrate target, the interception of the scanning beams by the radially disposed segments of their corresponding fiducial marks causing charged particles to be scattered from each of said fiducial marks;
(b) means for detecting the charged particles scattered from each of said fiducial marks;
(c) means for converting the detected charged particles scattered from each of said fiducial marks into a corresponding electrical reregistration signal; and
(d) means for changing the relative positioning of said substrate target and said plurality of charged particle beams to effect alignment between each of the scanning beams and its corresponding fiducial mark, the direction and magnitude of the positioning change being determined from the temporal relationship between each of the scanning beams and its corresponding reregistration signal, and the number of and temporal spacings between the intercepts of each of the reregistration signals, the positional alignment between said substrate target and said plurality of charged particle beams being achieved when for each of the reregistration signals the number of intercepts thereof equals the number of radially disposed segments of its corresponding fiducial mark and the temporal spacings between the intercepts are equal.

9. A reregistration system as recited in claim 8 wherein said charged particle beams consist of electrons.

10. A reregistration system as recited in claim 8 wherein said charged particle beams consist of ions.

11. A reregistration system as recited in claim 9 wherein said fiducial marks consist of a predetermined geometric pattern formed of a material having a high atomic number.

12. A reregistration system as recited in claim 9 wherein said fiducial marks consist of a predetermined topographic feature.

13. A reregistration system as recited in claim 10 wherein said fiducial marks consist of a predetermined geometric pattern formed of a material having a high atomic number.

14. A reregistration system as recited in claim 10 wherein said fiducial marks consist of a predetermined topographic feature.

15. In combination with a system which utilizes a plurality of charged particle beams formed by a screen lens to directly write a predetermined pattern on a substrate target, reregistration means for positionally aligning said substrate target relative to said screen lens comprising:
(a) means for scanning in a circular path at least two of said charged particle beams over a corresponding number of fiducial marks having a predetermined number of radially disposed segments and being situated at predetermined locations on the surface of said substrate target, the interception of the scanning beams by the radially disposed segments of their corresponding fiducial marks causing charged particles to be scattered from each of said fiducial marks;
(b) means for converting the charged particles scattered from each of said fiducial marks into a corresponding electrical reregistration signal; and
(c) means for changing the relative positioning of said substrate target and said screen lens to effect alignment between each of the scanning beams and its corresponding fiducial mark, the direction and magnitude of the positioning change being determined from the temporal relationship between each of the scanning beams and its corresponding reregistration signal, and the number of and temporal spacings between the intercepts of each of the reregistration signals, the positional alignment between said substrate target and said screen lens being achieved when for each of the reregistration signals the number of intercepts thereof equals the number of radially disposed segments of its corresponding fiducial mark and the temporal spacings between the intercepts are equal.

16. A reregistration system as recited in claim 15 wherein said charged particle beams consist of electrons.

17. A reregistration system as recited in claim 15 wherein said charged particle beams consist of ions.

18. A reregistration system as recited in claim 16 wherein said fiducial marks consist of a predetermined geometric pattern formed of a material having a high atomic number.

19. A reregistration system as recited in claim 16 wherein said fiducial marks consist of a predetermined topographic feature.

20. A reregistration system as recited in claim 17 wherein said fiducial marks consist of a predetermined geometric pattern formed of a material having a high atomic number.

21. A reregistration system as recited in claim 17 wherein said fiducial marks consist of a predetermined topographic feature.

22. In combination with a system which utilizes a plurality of charged particle beams formed by a screen lens to directly write a predetermined pattern on a substrate target, reregistration means for positionally aligning said substrate target relative to said screen lens comprising:

(a) means for scanning in a circular path at least two of said charged particle beams over a corresponding number of fiducial marks having a predetermined number of radially disposed segments and being situated at predetermined locations on the surface of said substrate target, the interception of the scanning beams by the radially disposed segments of their corresponding fiducial marks causing charged particles to be scattered from each of said fiducial marks;

(b) means for detecting the charged particles scattered from each of said fiducial marks;

(c) means for converting the detected charged particles scattered from each of said fiducial marks into a corresponding electrical reregistration signal; and (d) means for changing the relative positioning of said substrate target and said screen lens to effect alignment between each of the scanning beams and its corresponding fiducial mark, the direction and magnitude of the positioning change being determined from the temporal relationship between each of the scanning beams and its corresponding reregistration signal, and the number of and temporal spacings between the intercepts of each of the reregistration signals, the positional alignment between said substrate target and said screen lens being achieved when for each of the reregistration signals the number of intercepts thereof equals the number of radially disposed segments of its corresponding fiducial mark and the temporal spacings between the intercepts are equal.

23. A reregistration system as recited in claim 22 wherein said charged particle beams consist of electrons.

24. A reregistration system as recited in claim 22 wherein said charged particle beams consist of ions.

25. A reregistration system as recited in claim 23 wherein said fiducial marks consist of a predetermined geometric pattern formed of a material having a high atomic number.

26. A reregistration system as recited in claim 23 wherein said fiducial marks consist of a predetermined topographic feature.

27. A reregistration system as recited in claim 24 wherein said fiducial marks consist of a predetermined geometric pattern formed of a material having a high atomic number.

28. A reregistration system as recited in claim 24 wherein said fiducial marks consist of a predetermined topographic feature.

* * * * *